(12) United States Patent
Kim et al.

(10) Patent No.: US 6,784,476 B2
(45) Date of Patent: Aug. 31, 2004

(54) SEMICONDUCTOR DEVICE HAVING A FLASH MEMORY CELL AND FABRICATION METHOD THEREOF

(75) Inventors: Dong-Jun Kim, kyunggi-do (KR);
Jin-Ho Kim, San Jose, CA (US);
Yong-Kyu Lee, kyunggi-do (KR);
Min-Soo Cho, Kyunggi-do (KR);
Eui-Youl Ryu, Daejeon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/039,126

(22) Filed: Jan. 3, 2002

(65) Prior Publication Data

US 2002/0100926 A1 Aug. 1, 2002

(30) Foreign Application Priority Data

Jan. 31, 2001 (KR) ........................................ 2001-04588

(51) Int. Cl.[7] .................... H01L 27/108; H01L 29/76; H01L 29/94; H01L 31/119
(52) U.S. Cl. ........................................ 257/296; 257/314
(58) Field of Search .................... 257/296, 311, 257/315, 316, 314, 319, 320, 318, 336, 344, 408, 549, 550

(56) References Cited

U.S. PATENT DOCUMENTS

| | | | |
|---|---|---|---|
| 4,558,344 A | 12/1985 | Perlegos | 357/59 |
| 4,698,787 A | 10/1987 | Mukherjee et al. | 365/185 |
| 4,783,766 A | 11/1988 | Samachisa et al. | 365/185 |
| 4,794,565 A | 12/1988 | Wu et al. | 365/185 |
| 4,851,365 A | 7/1989 | Jeuch | 438/257 |
| 4,852,062 A | 7/1989 | Baker et al. | 365/185.15 |
| 5,073,513 A | 12/1991 | Lee | 438/267 |
| 5,120,672 A | 6/1992 | Mitchell et al. | 438/261 |
| 5,280,446 A | 1/1994 | Ma et al. | 365/185 |
| 5,455,792 A * | 10/1995 | Yi | 365/185.12 |
| 5,498,558 A | 3/1996 | Kapoor | 437/43 |
| 5,930,631 A | 7/1999 | Wang et al. | 438/286 |
| 6,043,530 A * | 3/2000 | Chang | 257/320 |
| 6,101,131 A * | 8/2000 | Chang | 365/185.33 |
| 6,125,060 A * | 9/2000 | Chang | 365/185.29 |
| 6,177,315 B1 * | 1/2001 | Bergemont et al. | 438/258 |
| 6,232,185 B1 * | 5/2001 | Wang | 438/266 |
| 6,291,297 B1 | 9/2001 | Chen | 438/265 |
| 6,433,382 B1 * | 8/2002 | Orlowski et al. | 257/315 |
| 6,459,121 B1 * | 10/2002 | Sakamoto et al. | 257/315 |
| 6,583,009 B1 | 6/2003 | Hui et al. | 438/264 |

OTHER PUBLICATIONS

Watanabe, et al., 1998 IEDM Technical Digest, p. 975, "Novel 0.44 um 2 Ti–salicide STI cell technology for high–density NOR flash memories and high performance embedded application".

* cited by examiner

Primary Examiner—David Nhu
(74) Attorney, Agent, or Firm—Mills & Onello, LLP

(57) ABSTRACT

In a non-volatile semiconductor memory device and a fabrication method thereof, a charge storage layer is formed on a substrate. A control gate layer is formed on the charge storage layer. A gate mask having a spacer-shape is formed on the control gate layer. The charge storage layer and the control gate layer are removed using the gate mask as protection to form a control gate and a charge storage region.

15 Claims, 19 Drawing Sheets

SEMICONDUCTOR DEVICE HAVING A FLASH MEMORY CELL AND FABRICATION METHOD THEREOF

This application relies for priority upon Korean Patent Application No. 2001-04588, filed on Jan. 31, 2001, the contents of which are herein incorporated by reference in their entirety.

FIELD OF THE INVENTION

The present invention relates to semiconductor memory devices in general, and more particularly to flash memory cells having select gates and fabrication methods thereof.

BACKGROUND OF THE INVENTION

A flash memory device is an advanced type of non-volatile memory device which can be erased electrically at a high speed without being removed from the circuit board as well as which retains information stored in its memory cells even when no power is supplied. Continuous improvements in flash memory technology had been made with different cell structures, which include stacked gate cells, split gate cells, source side injection cells and other types of cells, as described in U.S. Pat. No. 5,455,792 issued Oct. 3, 1995 to Yong-Wan Yi.

The stacked gate cell has floating gate and control gate electrodes, which are sequentially stacked. One example of the stacked gate cells is a cell proposed by Mukherjee et al. in U.S. Pat. No. 4,698,787 issued Oct. 6, 1987. The Mukherjee cell is shown in FIG. 1. The cell is formed on a substrate 101 and employs channel hot electron injection for programming of the cell at a drain 104 side and the Fowler-Nordheim (F-N) tunneling for erasing at a source 102 side. This stacked gate cell has been prevalently adopted as a unit cell of a number of flash memory devices with an advantage of its small cell size. Other recent examples of the stacked gate cells are disclosed by H. Watanabe et al. in 1998 IEDM Technical Digest, p. 975 in an article entitled "Novel 0.44 um$^2$ Ti-salicide STI cell technology for high-density NOR flash memories and high performance embedded application" and in a Korean Patent Laid-open Publication No. 99-48775.

However, the stacked gate cell has a major disadvantage referred to as an over-erase problem. The over-erase problem occurs in stacked gate cells when the floating gate 110 in FIG. 1 is overly discharged during the erase operation. The threshold voltages of over-erased cells are negative and such cells conduct current even when they are not selected by a read voltage applied to the control gate 112.

In order to solve the over-erase problem, two different types of cells have been introduced, including a two-transistor cell structure, disclosed by Perlegos in U.S. Pat. No. 4,558,344 issued Dec. 10, 1985, and a split gate cell disclosed by Samachisa et al. in U.S. Pat. No. 4,783,766 issued Nov. 8, 1988. Perlegos employs a select transistor. A select gate in the Periegos cell blocks the leakage current from an over-erased floating gate when the cell is not selected. Similarly, the split gate cell of Samachisa et al. solved the problem by introducing a select gate portion of a channel under a control gate. The select gate portion has the function of blocking the leakage current coming from the floating gate portion of channel under an over-erased floating gate, when the control gate is turned off.

The major drawback of a split gate cell is low programming efficiency. Split gate cells are programmed by the conventional channel hot electron injection method, which has a very low programming efficiency. Such low injection efficiency unnecessarily wastes power and prohibits faster programming.

In order to improve the efficiency of hot electron injection to the floating gate, the source side injection (SSI) cell has been introduced by Wu et al. as disclosed in U.S. Pat. No. 4,794,565 issued Dec. 27, 1988 and Mar et al. as disclosed in U.S. Pat. No. 5,280,446 issued Jan. 18, 1994. The SSI cell of disclosed by Wu is formed on a substrate 201 having a source 202 and a drain 204, as shown in FIG. 2. A select gate 206, often called a sidewall gate, is positioned at the source side of the conventional stacked gate structure in order to induce the hot electron injection from the source 202 to a floating gate 210 when a high voltage is applied to a control gate 212. It was reported that drastic improvements of program efficiency were realized, in hot electron injections of the source side injection cell on the order of 1,000 to 10,000 times more efficient, as compared to the conventional channel hot electron injection.

Meanwhile, a new non-volatile memory cell was introduced which has a MONOS (Metal-Oxide-Nitride-Oxide-Semiconductor) structure to reduce program voltage. The MONOS cell includes a thin dielectric layer composed of a lower silicon oxide layer (a tunnel oxide layer), a silicon nitride layer, and an upper silicon oxide layer (a top oxide layer). The thin dielectric layer is interposed between a semiconductor substrate and a control gate. The MONOS cell has state of a logic "0" when electrons are trapped in the silicon nitride layer. The MONOS cell has the other stage of a logic "1" when electrons are not trapped in the silicon nitride layer. An example of a MONOS cell is described in U.S. Pat. No. 5,930,631 issued Jul. 27, 1999 to Chih-Hsien Wang et al. As shown in FIG. 3, the Wang cell has a source 402, a drain 404 and a channel therebetween in a substrate 401. A select gate 406 is formed on the substrate 401. An ONO (oxide/nitride/oxide) layer 420 is formed on the select gate 406 and the substrate 401. A control gate 408 is formed on the ONO layer 420. A lightly doped drain (LDD) structure is adapted to the drain for the purpose of reducing hot carriers near the drain junction. In the programming mode, hot carriers tunnel to the ONO layer 420 and are trapped in the nitride layer. In order to accomplish this, the control gate 408, the select gate 406 and the drain 404 are positively biased while the source 402 is ground. In the erase mode, carriers tunnel from the ONO layer 420 to the drain 404. In the erasure mode, the drain 404 is at a high voltage while the select gate 406 is off. The select gate 406 serves to conserve power because the device is erased without causing current to flow through the channel of the device.

SUMMARY OF THE INVENTION

It is an object of the present invention to provide a non-volatile memory device having a minimized cell size and low power consumption during a program operation.

Another object of the present invention is to provide a method for forming a non-volatile memory device having a minimized cell size and low power consumption during a program operation.

According to one aspect of the invention, a non-volatile memory device comprises a substrate, a charge storage region stacked on the substrate, a control gate stacked on the charge storage region and a gate mask stacked on the control gate. The gate mask has a spacer-shape.

According to another aspect of the invention, a non-volatile memory device comprises a substrate having a source and a drain. The substrate also has a channel between the source and the drain. A charge storage region is formed on the channel, and a control gate is formed on the charge storage region. A select gate is formed on the channel and between charge storage region and the drain. The charge storage region, the channel, the drain, the control gate and the select gate constitute a first unit cell.

According to another aspect of the invention, a method for forming a non-volatile memory device comprises forming a charge storage layer on a substrate and forming a control gate layer on the charge storage layer. A gate mask having a spacer-shape is formed on the control gate layer. The charge storage layer and the control gate layer are partially removed. During the removal process, the gate mask protects a portion of the charge storage layer and the control gate layer to form a control gate and a charge storage region.

In a preferred embodiment, a select gate is formed on the substrate and a sidewall of the charge storage region, and a conductive region is formed on the substrate adjacent another sidewall of the charge storage region. The charge storage region, the control gate, the gate mask and the select gate constitute a first unit cell. A second unit cell, symmetrical and opposite to the first unit cell, may share the conductive region with the first unit cell.

The first unit cell may comprise a LDD spacer on a sidewall of the select gate.

A drain may be formed in the substrate adjacent to the select gate and opposite to the conductive region, and a bit line electrode may be electrically connected to the drain. A source electrode may be provided on the conductive region, wherein the source electrode is electrically isolated from the control gate by a source-side spacer.

The select gate is preferably in the shape of a spacer, and the charge storage region may comprise a floating gate dielectric layer on the substrate, a floating gate on the floating gate dielectric layer and an inter poly dielectric layer on the floating gate. Alternatively, the charge storage region preferably comprises an ONO layer.

BRIEF DESCRIPTION OF THE DRAWINGS

Other features of the present invention will be more readily understood from the following detailed description of preferred embodiments thereof when read in conjunction with the accompanying drawings, in which.

DETAILED DESCRIPTION OF PREFERRED EMBODIMENTS

The present invention will now be described more fully hereinafter with reference to the accompanying drawings.

Figure 1:
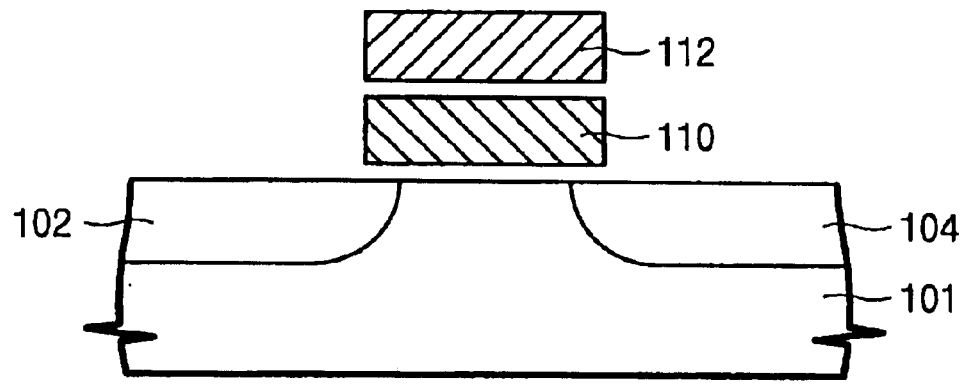
FIG. 1 is a cross sectional schematic view illustrating a stacked gate cell of a conventional flash memory device.
Figure 2:
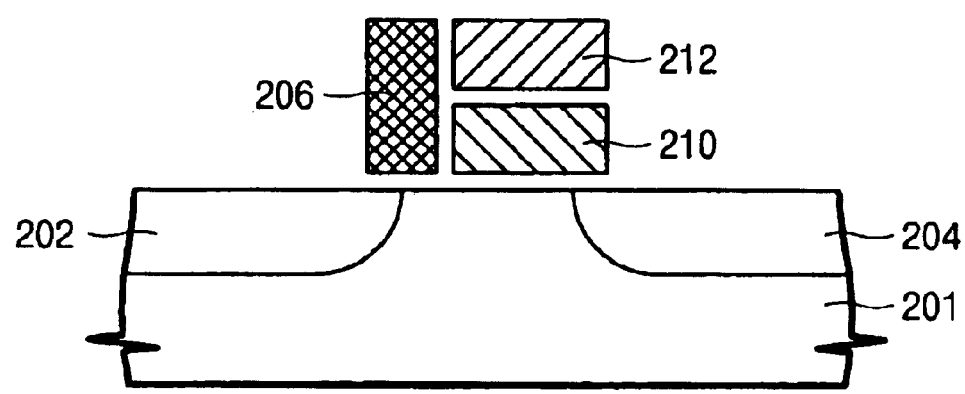
FIG. 2 is a cross sectional schematic view illustrating a source side injection (SSI) cell of a conventional flash memory device.
Figure 3:
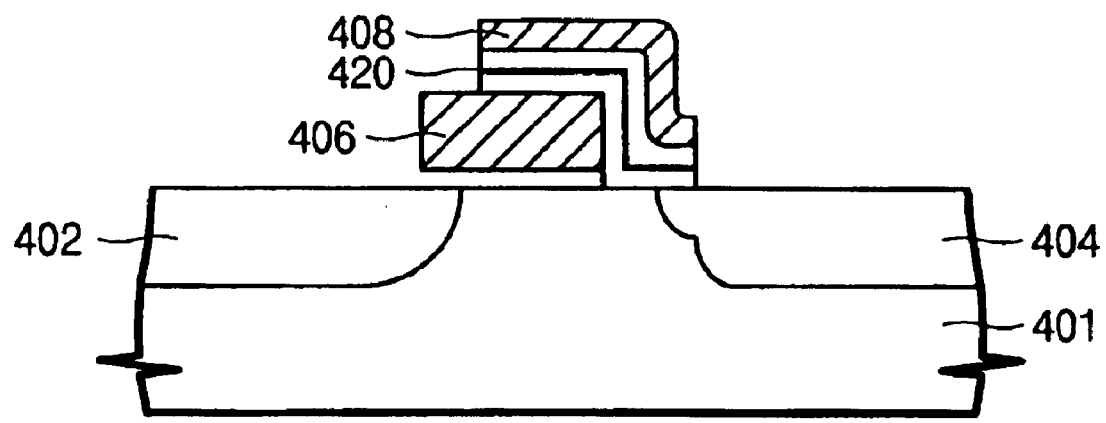
FIG. 3 is a cross sectional schematic view illustrating a MONOS cell of a conventional flash memory device.
Figure 4:
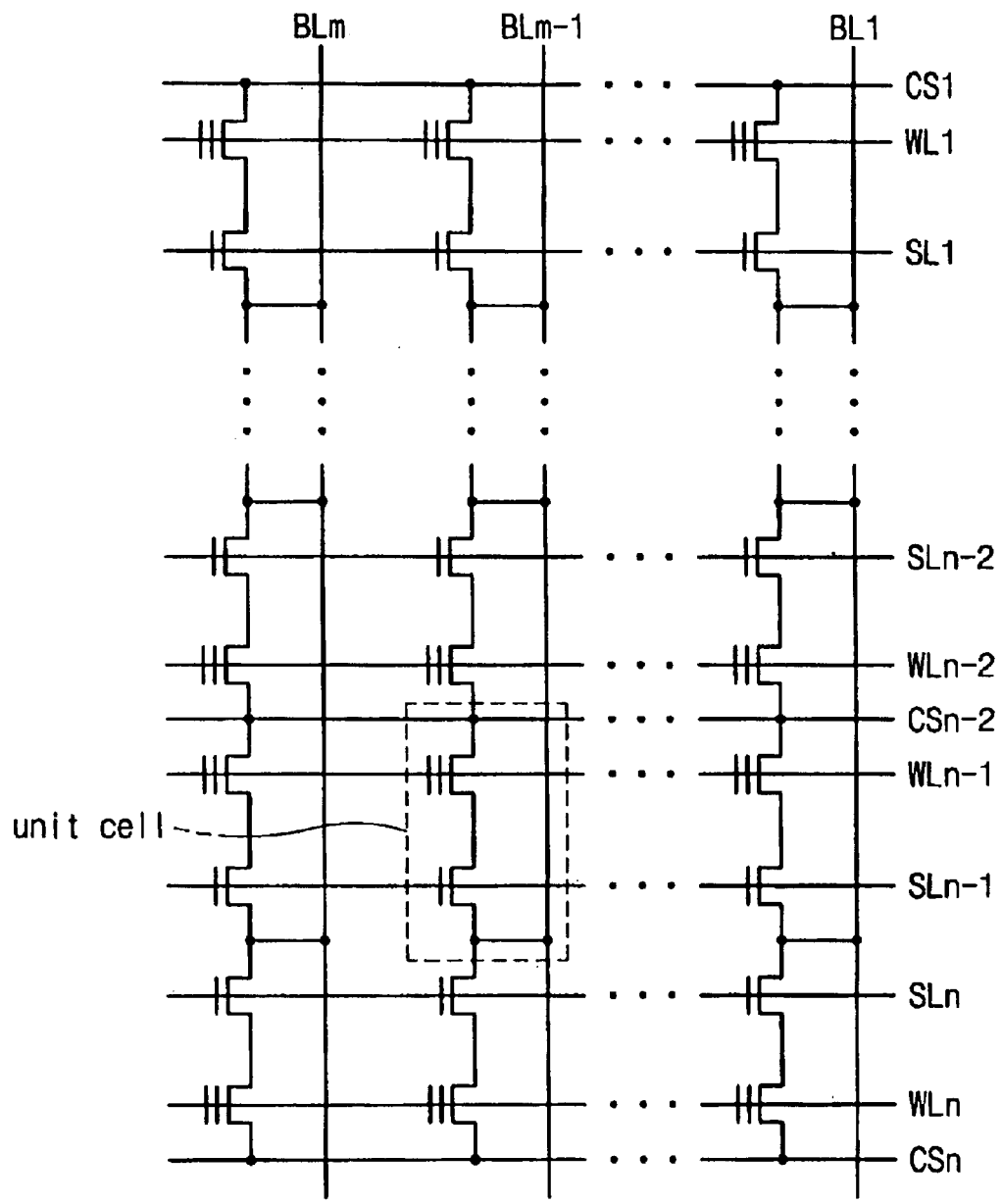
FIG. 4 is a circuit drawing illustrating an array of flash memory cells of first and second embodiments of the present invention.

FIG. 4 is a circuit drawing illustrating an array of flash memory cells of the present invention. A semiconductor flash memory device of the present invention comprises a plurality of flash memory cells organized in a matrix. That is to say, the cells are arranged in rows and columns. Unit cells are located at the respective intersections formed by a plurality of word lines termed WL and a plurality of bit lines termed BL in the matrix. A total number of cells in the matrix is calculated as 'm' times 'n'; where 'm' represents the number of cells in the row direction, and 'n' represents the number of cells in the column direction. The unit cell is one of cells of a first and a second embodiment, which will be described later. The bit lines extend in the column direction and the word lines extend in the row direction. The array further includes a plurality of select lines (SL) and a plurality of common source lines (CS), both of which extend in the row direction. The word lines and the select lines are arranged symmetrically to corresponding common source lines in the column direction. This is because two adjacent unit cells share one common source line, and the two unit cells have a symmetrical structure, as described later.

Figure 5:
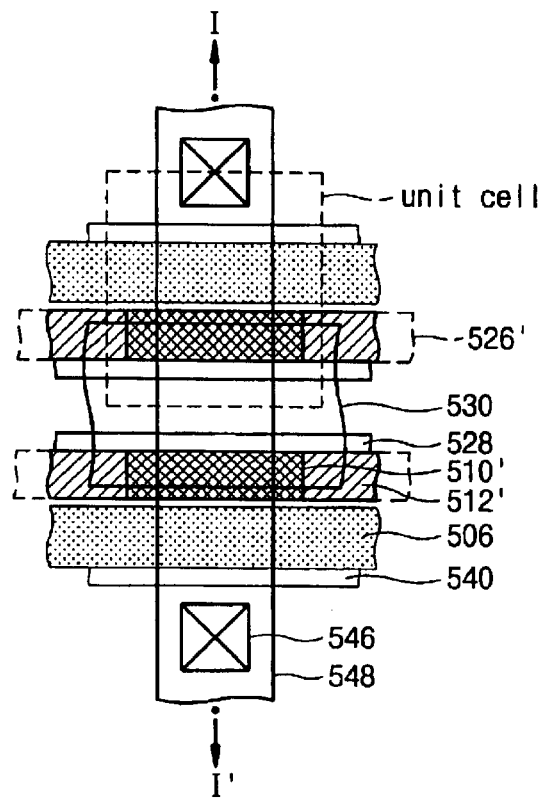
FIG. 5 is a planar schematic view illustrating the flash memory cells of the first embodiment of the present invention.
Figure 6:
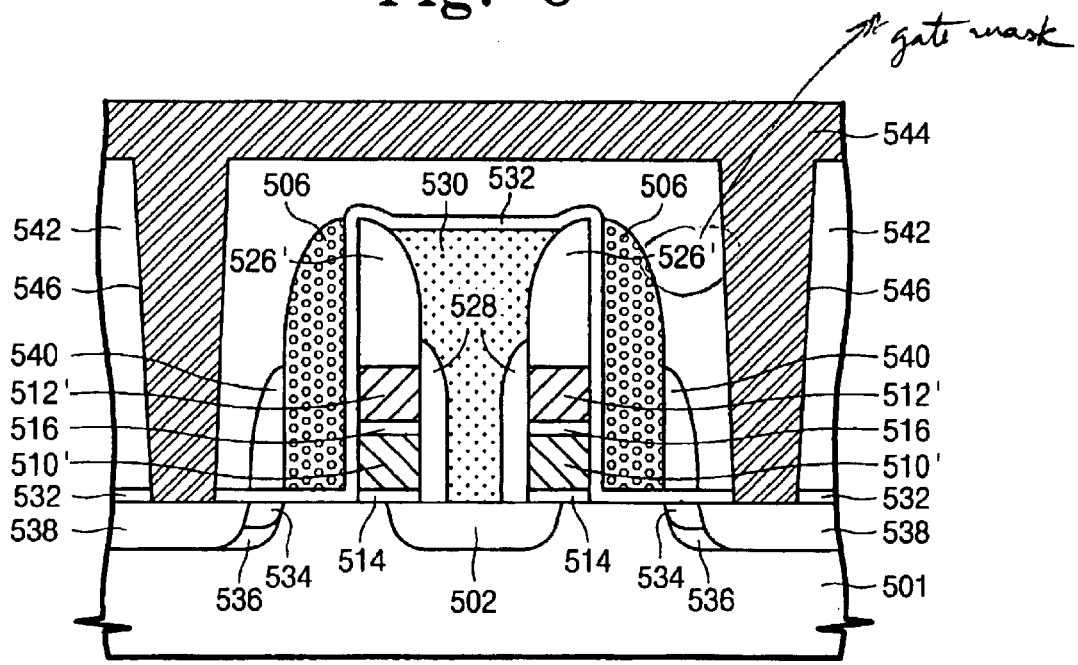
FIG. 6 is a cross sectional schematic view illustrating the flash memory cells of the first embodiment of the present invention.

FIG. 5 is a planar schematic view illustrating the flash memory cells of a first embodiment of the present invention, and FIG. 6 is a cross sectional schematic view through line I–I' of FIG. 5. FIGS. 5 and 6 illustrate two unit cells, which are symmetrical about a source electrode 530 and a source 502. That is to say, the source electrode 530 and the source 502 are involved in each of the two unit cells. In FIG. 6, one unit cell comprises elements to the left side of the source electrode 530 and the source 502. The other unit cell comprises elements to the right side of the source electrode 530 and the source 502. The planar structure of the two unit cells of FIG. 5 is repeated in the row direction and the column direction to form the array.

Referring to FIG. 6, a substrate 501 of a first conductivity type includes conductive regions, i.e. the source 502, and a drain, that are spaced apart from each other by a channel. The conductive regions consist of impurity doped regions. The drain includes a LDD region 534, a halo region 536 and a highly doped region 538. The source 502 has a second conductivity type, which is opposite the first conductivity type. Both the LDD region 534 and the highly doped region 538 have the second conductivity type. However, the LDD region 534 has a lower doping concentration and shallower junction depth than that of the highly doped region 538. The halo region 536 has the first conductivity type and is located under the LDD region 534.

A charge storage region is located on the channel adjacent to the source 502. The charge storage region includes a floating gate dielectric layer 514, a floating gate 510' and an inter poly dielectric layer 516. A control gate 512' and a gate mask 526' are stacked sequentially on the charge storage region. The gate mask 526' has a spacer-shape as shown in the figure. A source-side spacer 528 is located on a sidewall of the charge storage region and the control gate 512'. The source electrode 530 electrically contacts the source 502. The source electrode 530 is spaced apart and electrically isolated from the charge storage region and the control gate

512' by the source-side spacer 528. A select gate dielectric layer 532 is formed on another sidewall of the charge storage region, on the control gate 512' and a portion of the channel. A select gate 506 is located on the select gate dielectric layer 532 and has the shape of a lateral spacer. A LDD spacer 540 is formed on a sidewall of the select gate 506. A bit line contact 546 is formed in an insulating layer 542. A bit line electrode 544 is formed on the insulating layer 542 and in the bit line contact 546. The bit line electrode 544 electrically contacts the drain.

Referring to FIG. 5, an active region 548 extends to adjacent cells in the column direction in the substrate 501. The active region 548 is isolated from other adjacent active regions by isolation regions therebetween (not shown).

The active region 548 includes the source 502, the channel and the drain. The floating gate 510' is isolated from other elements of the cell and is not extended to adjacent cells. The control gate 512', the gate mask 526', the source-side spacer 528, the source electrode 530, the select gate 506 and the LDD spacer 540 extend to adjacent cells in the row direction. The word line WL consists of the control gate 512'. The common source line CS consists of the source electrode 530. The select line SL consists of the select gate 506. The bit line BL consists of the bit line electrode, which extends to adjacent cells in the column direction, though not shown.

In the second embodiment of the present invention, a charge storage region consists of an ONO layer on a substrate. The ONO layer extends to adjacent cells in the row direction, as does the control gate. The other elements are the same as the first embodiment of the present invention.

In an example of programming operations of the cells of the first and second embodiments, the channel hot electron injection technique may be employed. That is to say, electrons are trapped into the floating gate 510' or the nitride layer of the ONO by applying a set of positive program voltages to the word line WL and to the bit line BL. Application of a positive select voltage to the select line SL limits current between the source 502 and the drain. Therefore, high power consumption can be prevented. The select voltage also induces a strong lateral electric field in the channel adjacent to a boundary region between the select gate 506 and the charge storage region, thereby increasing program efficiency. The select voltage is high enough to induce inversion in the channel under the select gate 506.

In an example of erasure operations of the cells, a hot hole injection technique may be employed. That is to say, hot holes are trapped into the floating gate 510' or the nitride layer of the ONO by applying a positive erasure voltage to the bit line BL. The word line WL is grounded. Moreover, applying another positive select voltage to the select gate 506 enhances the injection by accelerating the hot holes.

FIGS. 7A to 7J and FIGS. 8A to 8J are schematic views illustrating a process for forming the flash memory cells of the first embodiment of the present invention. FIGS. 7A to 7J are cross sectional schematic views along line II–II' of FIGS. 8A to 8J, which are planar schematic views.

Figure 7A:
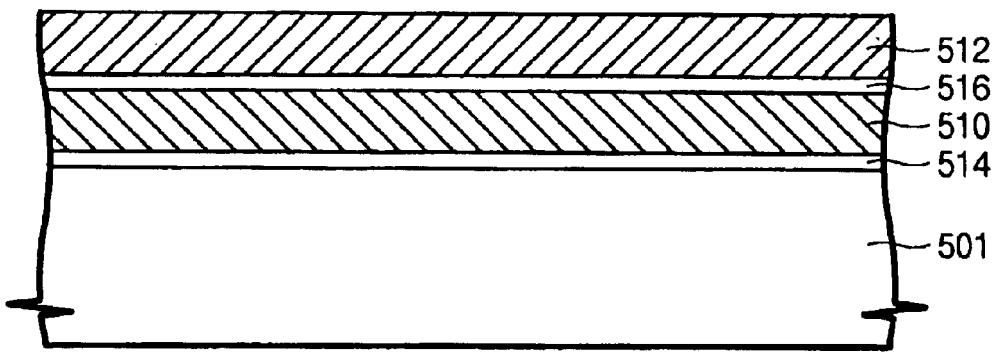
FIGS. 7A to 7J are cross sectional schematic views illustrating a process for forming the flash memory cells of the first embodiment of the present invention.
Figure 8A:
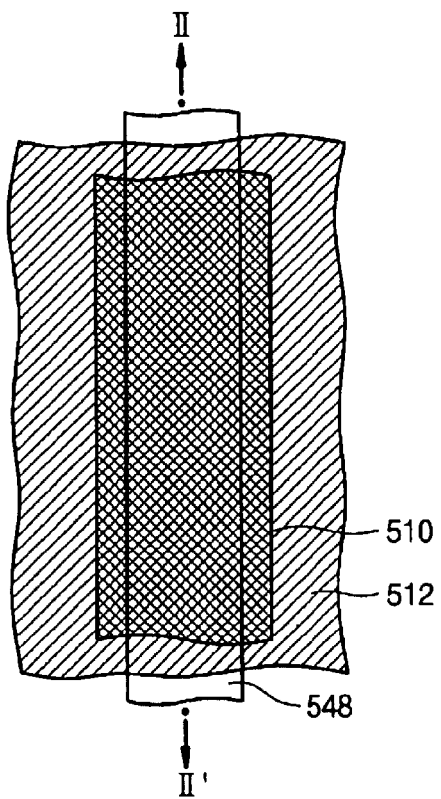
FIGS. 8A to 8J are plane schematic views illustrating the process for forming the flash memory cells of the first embodiment of the present invention.

Referring to the FIG. 7A and FIG. 8A, there is shown a substrate 501, preferably composed of monocrystalline silicon, though not shown in FIG. 8A. The substrate 501 is doped with impurities of a first conductivity type. For example, the impurities may comprise boron. An active region 548 (not shown in FIG. 7A) is formed in the substrate 501 using the conventional LOCOS method or the conventional trench isolation method. The active region 548 extends to the adjacent cells in the column direction. A floating gate dielectric layer 514 is formed on the substrate (not shown in the FIG. 8A). The floating gate dielectric layer 514 is preferably composed of silicon dioxide by thermal oxidation of the substrate 501, or silicon oxynitride by the CVD (chemical vapor deposition) method. A floating gate layer 510 is formed on the floating gate dielectric layer 514, and then patterned using a photo/etching method, thereby extending to the adjacent cells in the column direction. The floating gate layer 510 is preferably composed of doped polycrystalline silicon or polycide. An inter poly dielectric layer 516 (not shown in FIG. 8A) is formed on the floating gate layer 510. The inter poly dielectric layer 516 is preferably composed of silicon dioxide or the ONO layer by the CVD method. The floating gate dielectric layer 514, floating gate layer 510 and the inter poly dielectric layer 516 constitute a charge storage layer.

A control gate layer 512 is formed on the inter poly dielectric layer 516. The control gate layer 512 is preferably composed of doped polycrystalline silicon or polycide.

Figure 7B:
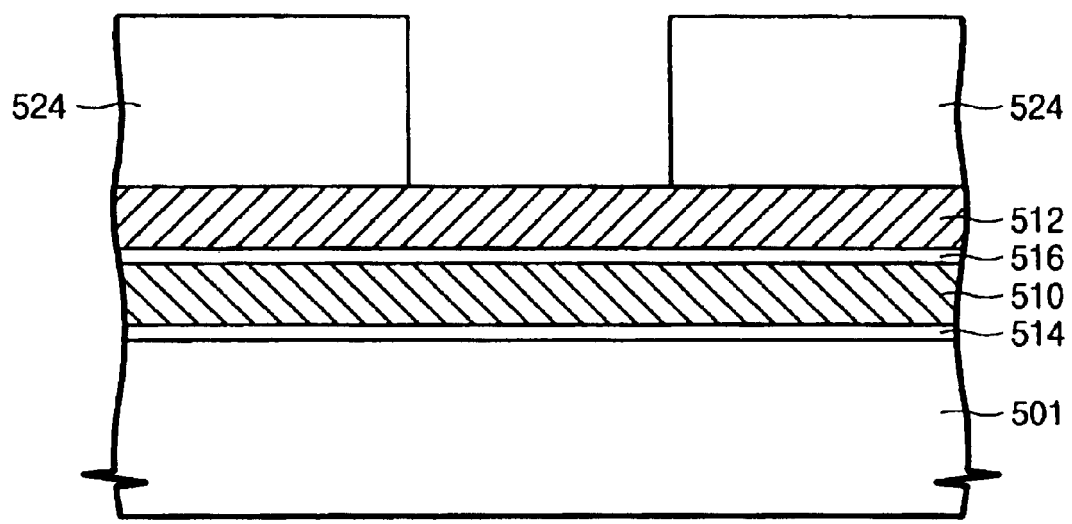
Figure 8B:
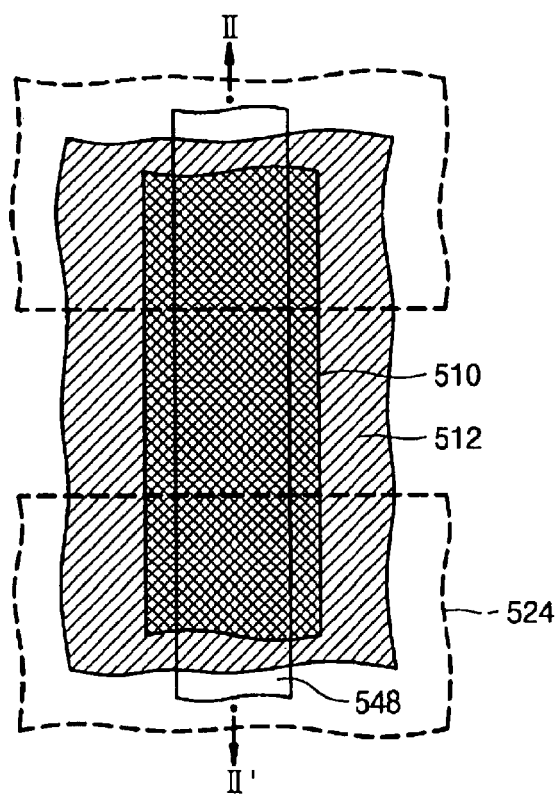

Referring to FIG. 7B and FIG. 8B, a disposable layer is formed on the control gate layer 512. The disposable layer is preferably composed of silicon nitride. Using a photo/etching method, the disposable layer is patterned to form disposable patterns 524 on the control gate layer 512. The disposable patterns 524 are spaced apart from each other by a distance extending to adjacent cells in the row direction. Impurities such as arsenic or phosphorus may be implanted to a surface region of the substrate 501 using the disposable patterns 524 as implantation masks, in order to decrease doping concentration of the boron of the first conductivity type at the surface region. This implantation is performed by penetrating the floating gate dielectric layer 514, the floating gate layer 510, the inter poly dielectric layer 516 and the control gate layer 512. This implantation can enhance the program efficiency in the channel during the program operation. Additional impurities such as arsenic or phosphorus may be implanted to the control gate layer 512 using the disposable patterns 524 as implantation masks. This additional implantation can increase the conductivity of the control gate layer 512.

Figure 7C:
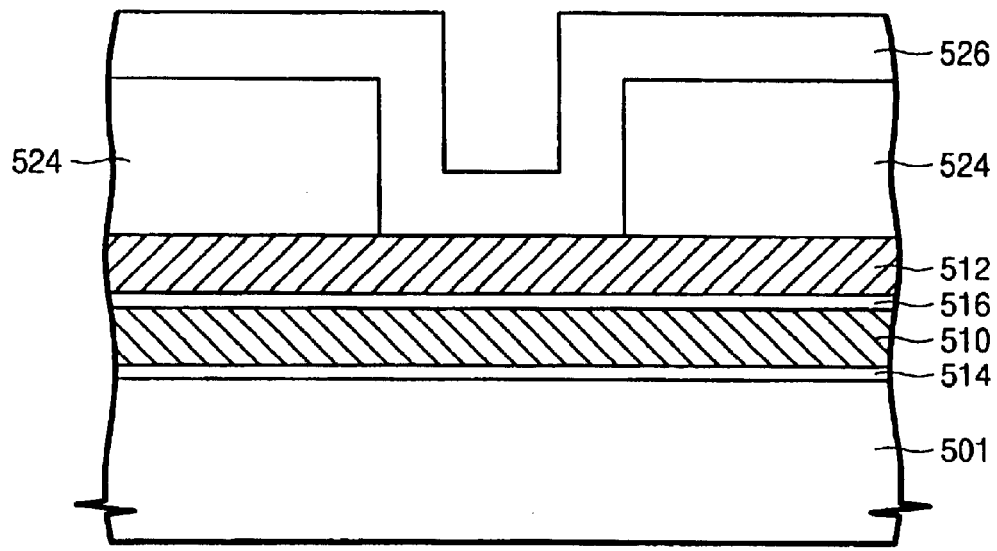
Figure 8C:
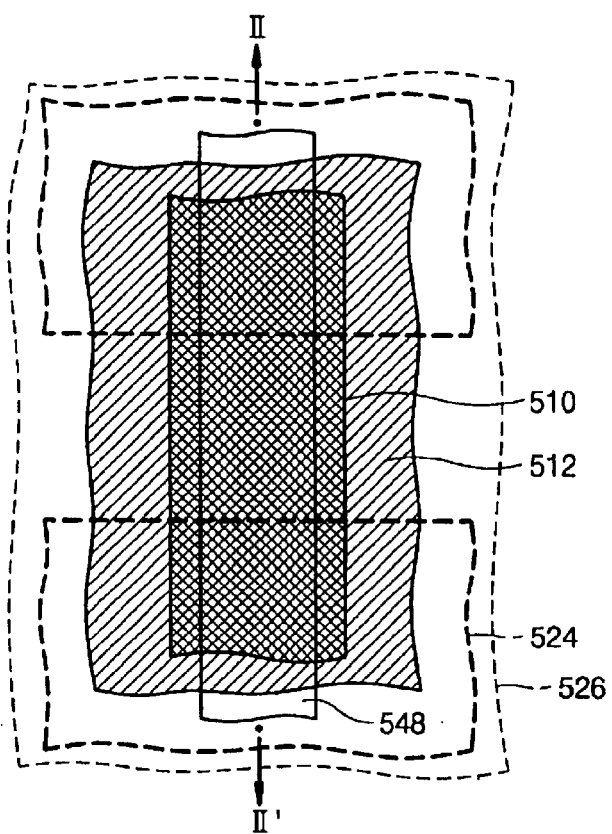

Referring to FIG. 7C and FIG. 8C, a gate mask layer 526 is formed on the resultant structure. The gate mask layer 526 is preferably composed of silicon dioxide with a selected thickness.

Figure 7D:
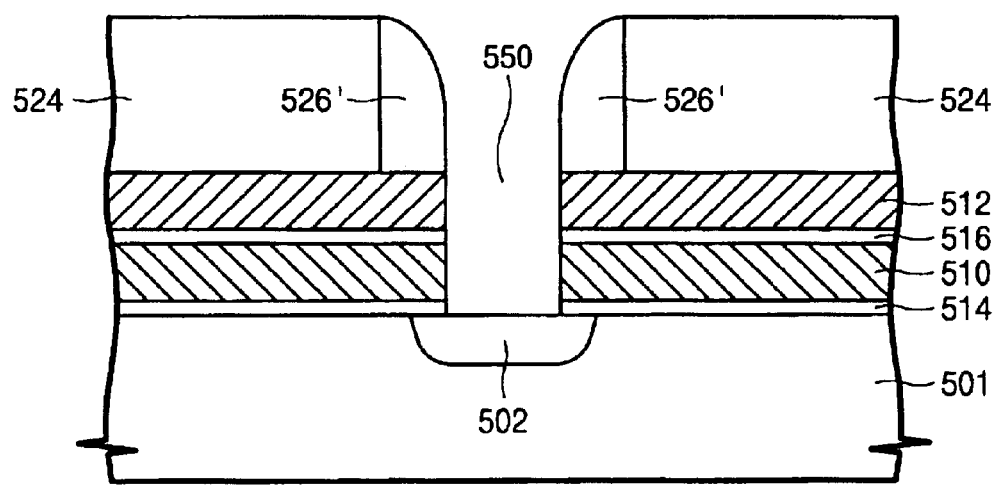
Figure 8D:
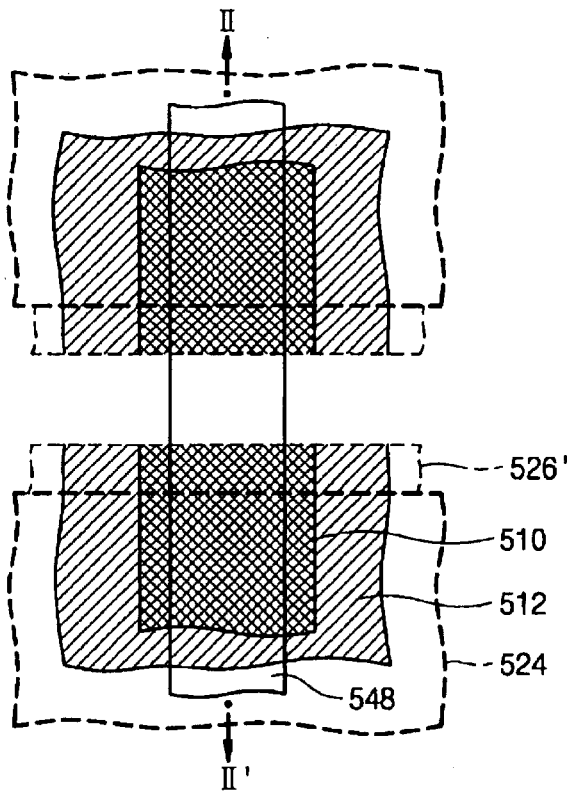

Referring to the FIG. 7D and FIG. 8D, the gate mask layer 526 is anisotropically etched to form gate masks 526' of spacer-shape on the control gate layer 512 and on sidewalls of the disposable patterns 524. The gate masks 526' are extending to the adjacent cells in the row direction. Subsequently, the floating gate dielectric layer 514, the floating gate layer 510, the inter poly dielectric layer 516 and the control gate layer 512 are etched using the gate masks 526' and the disposable patterns 524 as etching masks, thereby exposing the substrate 501 and forming a source contact 550. A source region 502 (not shown in FIG. 8D) is formed by implanting arsenic ions into substrate 501 using the gate masks 526' and the disposable patterns 514 as implantation masks. A thermal annealing may be performed to activate impurities of the source 502.

Figure 7E:
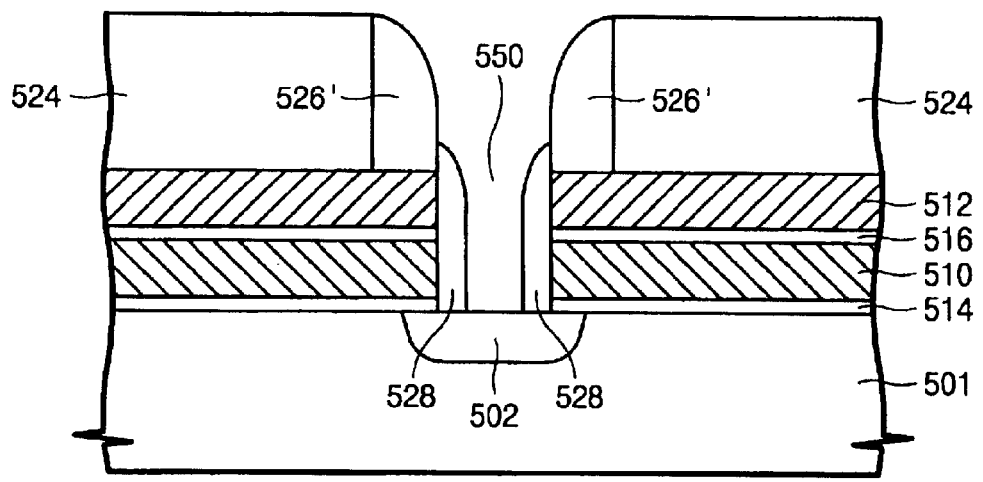
Figure 8E:
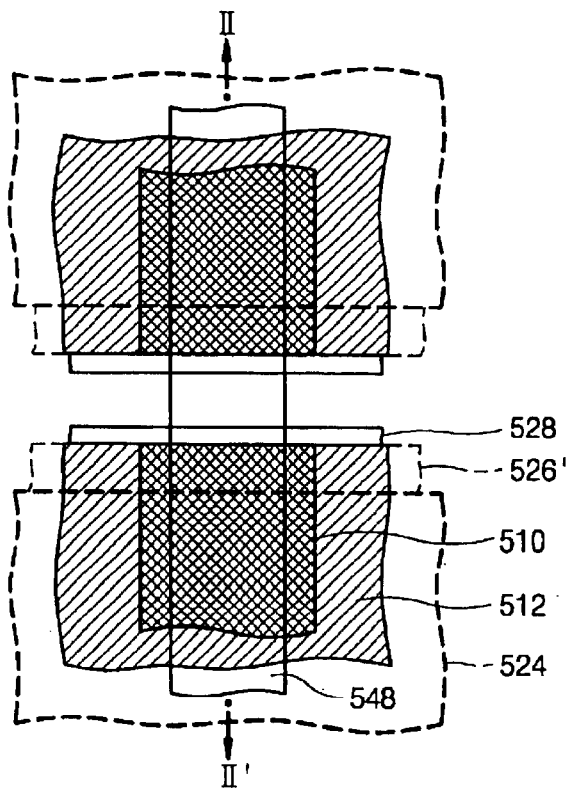

Referring to FIG. 7E and FIG. 8E, a source-side spacer layer is deposited on the resultant structure. The source-side spacer layer is preferably composed of silicon dioxide. The source-side spacer layer is anisotropically etched to form source-side spacers 528 on sidewalls of the floating gate dielectric layers 514, the floating gate layers 510, the inter poly dielectric layers 516 and the control gate layers 512. The source-side spacers 528 extend to adjacent cells in the row direction.

Figure 7F:
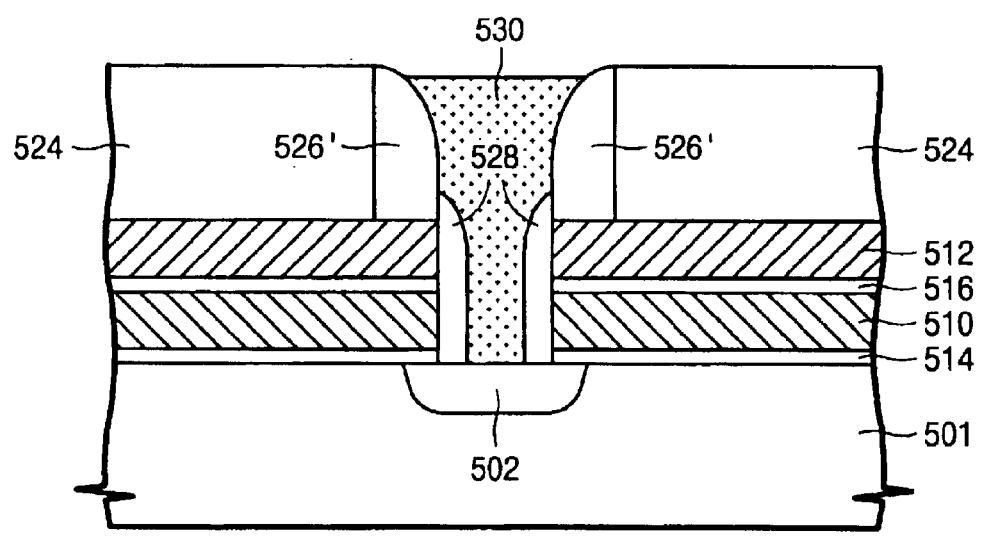
Figure 8F:
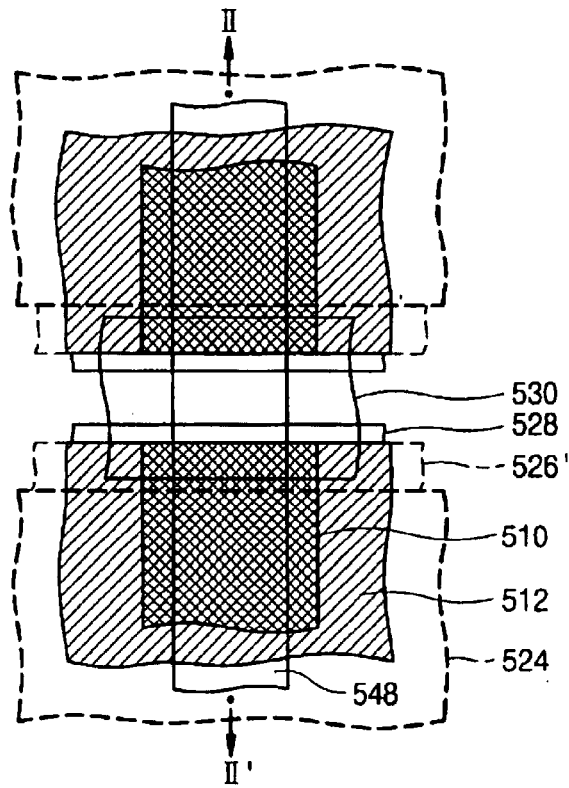

Referring to FIG. 7F and FIG. 8F, a source electrode layer is deposited on the resultant structure, thereby filling the source contact 550. The source electrode layer is preferably composed of tungsten or doped polycrystalline silicon. The source-side spacer layer is etched back or polished by CMP (chemical mechanical polishing) method to form a source electrode 530 in the source contact 550. The source electrode 530 extends to the adjacent cells in the row direction.

Figure 7G:
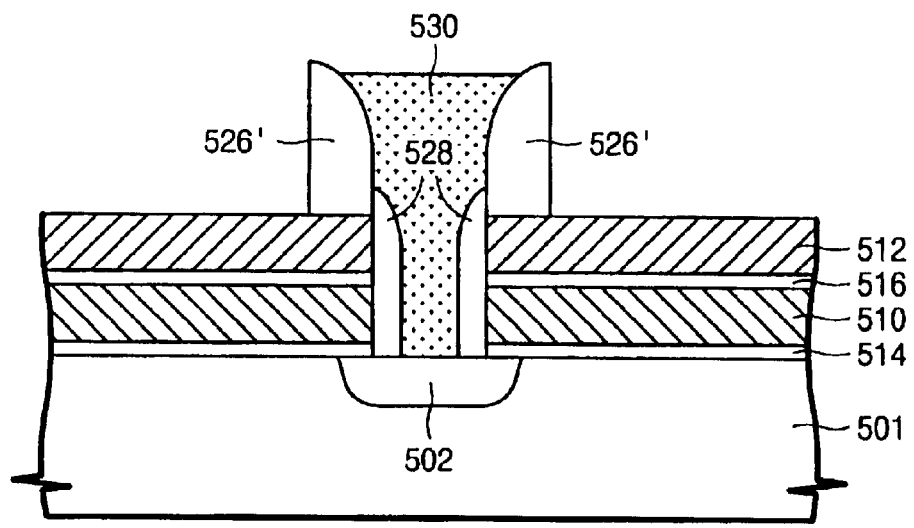
Figure 8G:
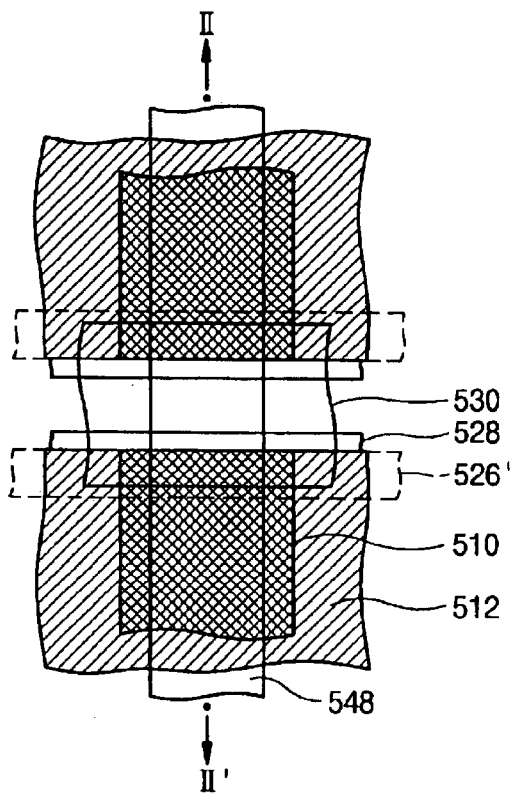

Referring to FIG. 7G and FIG. 8G, the disposable patterns 524 are removed by a dry etching or a wet etching method.

Figure 7H:
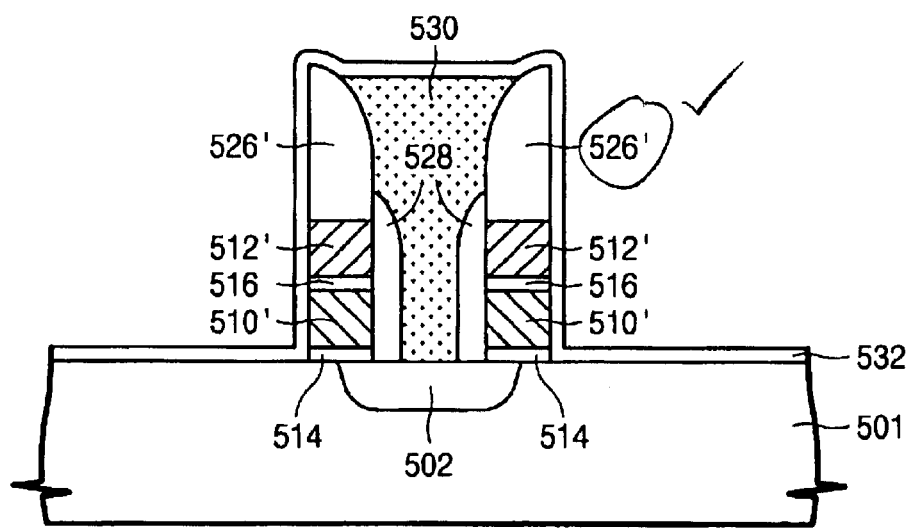
Figure 8H:
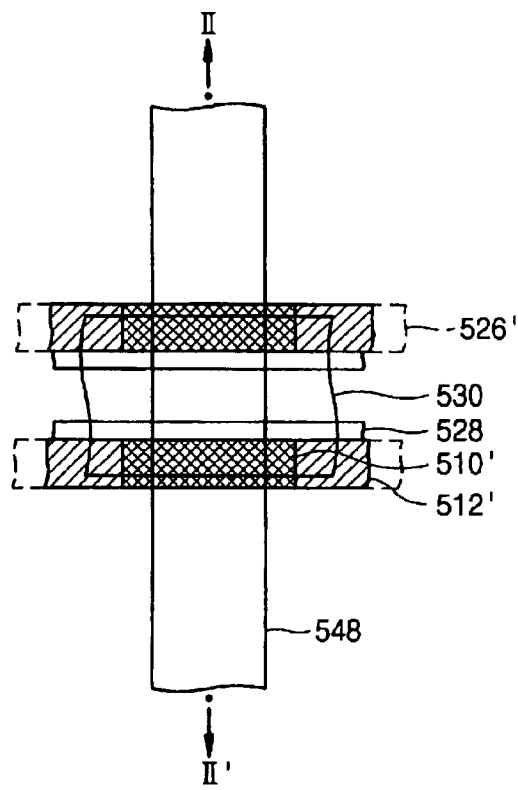

Referring to FIG. 7H and FIG. 8H, the floating gate dielectric layers 514, the floating gate layers 510, the inter poly dielectric layers 516 and the control gate layers 512 are etched again using the gate masks 526' and the source electrode 530 as etching masks. As a result, control gates 512' and charge storage regions having floating gates 510' are formed and a portion of the substrate is exposed. During this etching, a portion of the source electrode 530 may be etched, thereby being recessed. The control gates 512' and floating gates 510' extend to the adjacent cells in the row direction. Subsequently, a select gate dielectric layer 532 is formed on the resultant structure. The select gate dielectric layer 532 is preferably composed of CVD silicon dioxide. A thin thermal oxide layer may be formed on the exposed portion of the substrate, before the formation of the select gate dielectric layer 532.

Figure 7I:
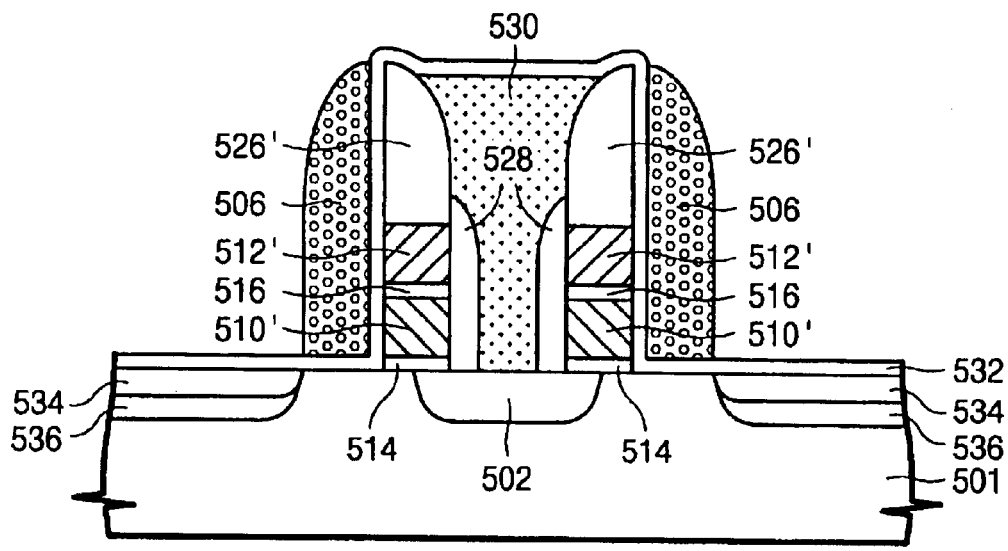
Figure 8I:
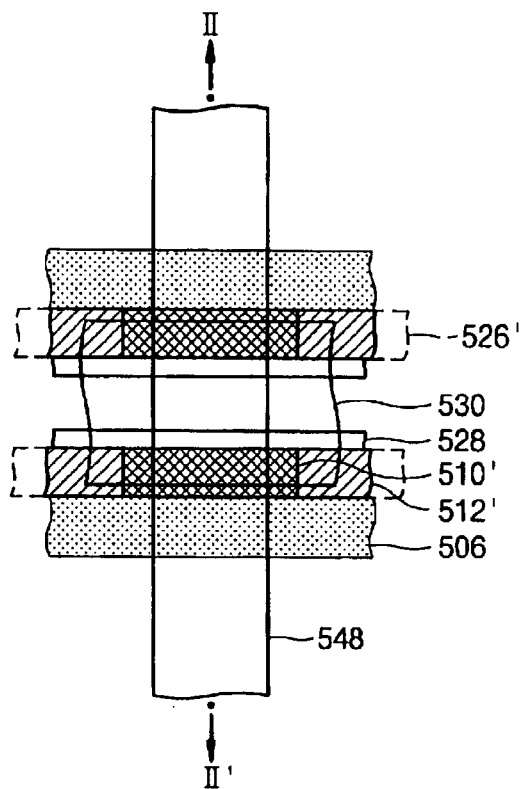

Referring to FIG. 7I and FIG. 8I, A select gate layer is deposited on the resultant structure. The select gate layer is preferably composed of doped polycrystalline silicon. The select gate layer is anisotropically etched to form select gates 506 of spacer-shape on sidewalls of the control gates 512' and the floating gates 510'. The select gates 506 extend to the adjacent cells in the row direction. Subsequently, LDD regions 534 (not shown in FIG. 8I) are formed in the substrate 510 by using phosphorus ion implantation, and halo regions 536 (not shown in FIG. 8I) are formed under the LDD regions 534 by using boron ion implantation. In these ion implantations, the select gates 506 are used as implantation masks.

Figure 7J:
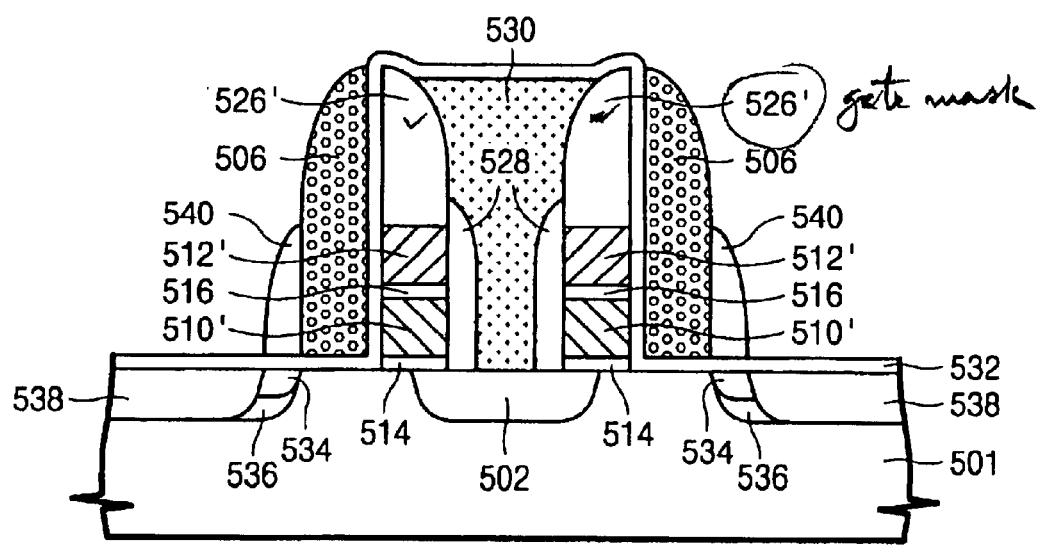
Figure 8J:
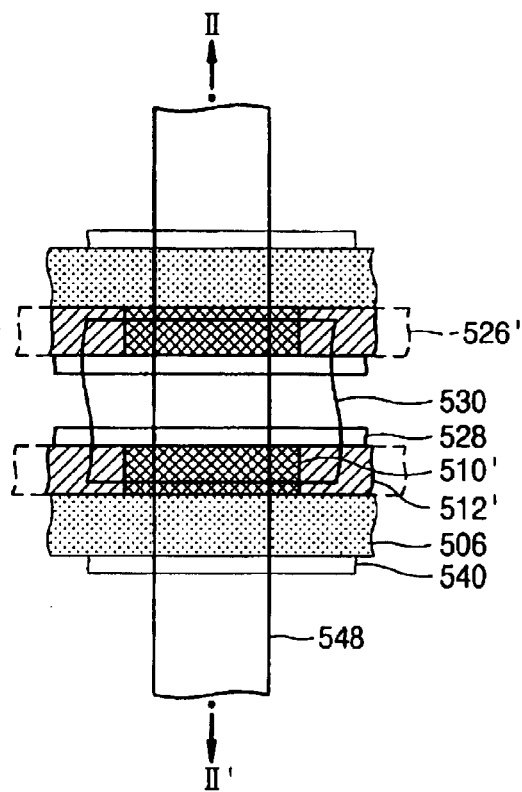

Referring to the FIG. 7J and FIG. 8J, A LDD spacer layer is deposited on the resultant structure. The LDD spacer layer is preferably composed of silicon dioxide. The LDD spacer layer is anisotropically etched to form LDD spacers 540 on sidewalls of the select gates 506. The LDD spacers 540 extend to adjacent cells in the row direction. Highly doped regions 538 are formed in the substrate 510 by using arsenic ion implantation (not shown in FIG. 8I). The impurity concentration of the highly doped regions 538 is much higher than those of the LDD regions 534 and the halo regions 536. Therefore, the highly doped regions 538 are formed to compensate a portion of the LDD regions 534 and the halo regions 536, as shown the figure. In this ion implantation, the select gates 506 and LDD spacers 540 are used as implantation masks. The LDD region 534, the halo region 536 and the highly doped region 538 constitute a drain.

Subsequently, a conventional metalization process is performed. That is to say, an insulating layer is formed on the resultant structure. Bit line contacts are formed in the insulating layer by a photo/etching method, thereby exposing the drains. A bit line metal composed of aluminum is deposited on the resultant structure. The bit line metal is patterned by a photo/etching method, thereby forming the bit line electrode.

FIGS. 9A to 9J are cross sectional schematic views illustrating a process for forming the flash memory cells of the second embodiment of the present invention.

Figure 9A:
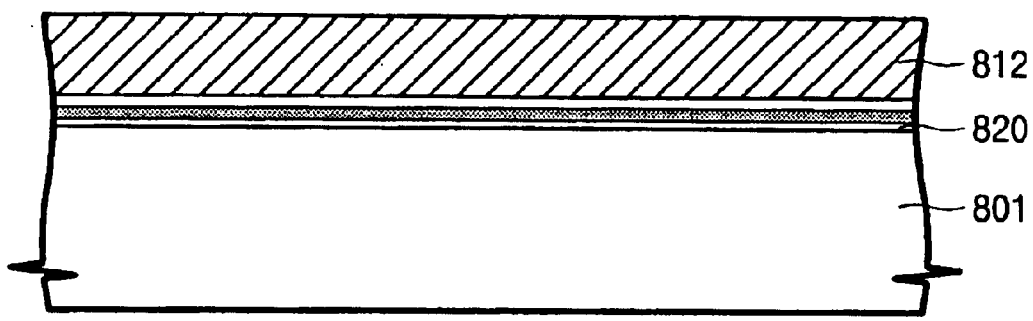
FIGS. 9A to 9J are cross sectional schematic views illustrating a process for forming cells of the second embodiment of the present invention.

Referring to the FIG. 9A, there is shown a substrate 801, preferably composed of monocrystalline silicon. The substrate 801 is doped with impurities of a first conductivity type. For example, the impurities are boron. An active region is formed using the same method as the first embodiment, though not shown in the figure. A charge storage layer 820 is formed on the substrate, preferably composed of an ONO layer. A control gate layer 812 is formed on the charge storage layer 820 using the same method as the first embodiment. There is no need to pattern the ONO layer prior to the formation of the control gate layer 812.

Figure 9B:
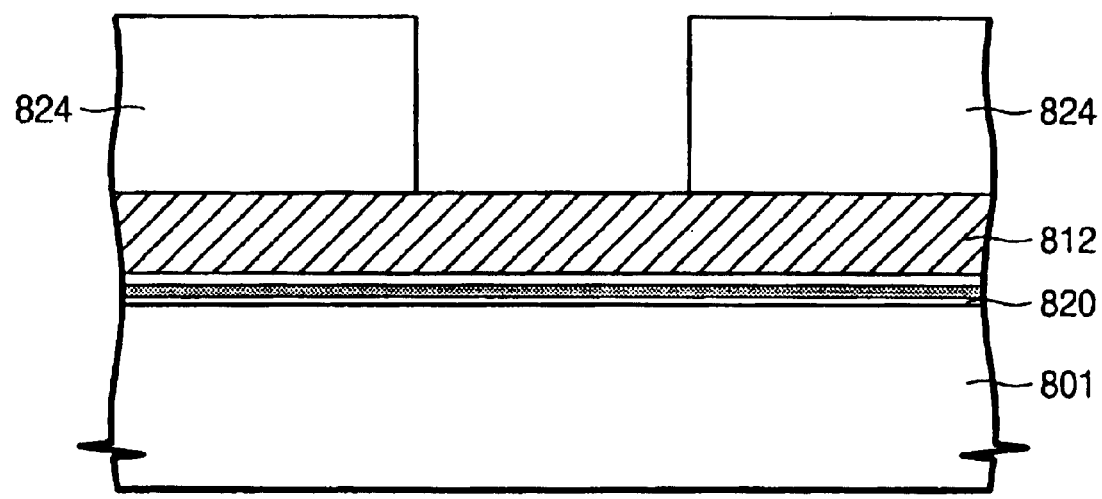

Referring to the FIG. 9B, disposable patterns 824 are formed on the control gate layer 812 using the same method as the first embodiment. Impurities such as arsenic or phosphorus may be implanted on a surface of the substrate 801 using the disposable patterns 824 as implantation masks, in order to decrease a doping concentration of the boron of the first conductivity type at the surface region. This implantation is performed by penetrating the charge storage layer 820 and the control gate layer 812. This implantation can enhance the program efficiency in the channel during the program operation. Additional impurities such as arsenic or phosphorus may be implanted to the control gate layer 812 using the disposable patterns 824 as implantation masks. This additional implantation can increase the conductivity of the control gate layer 812.

Figure 9C:
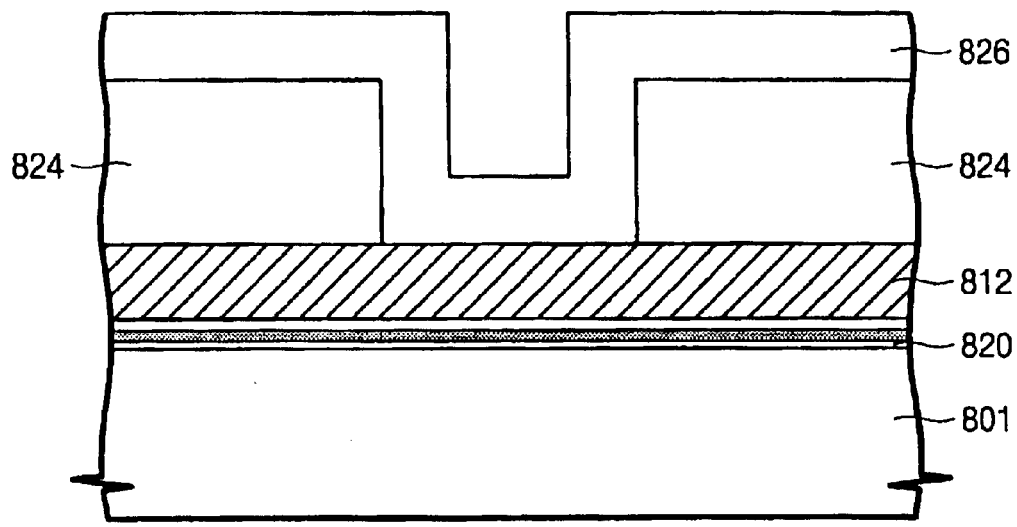

Referring to FIG. 9C, a gate mask layer 826 is formed using the same method as the first embodiment.

Figure 9D:
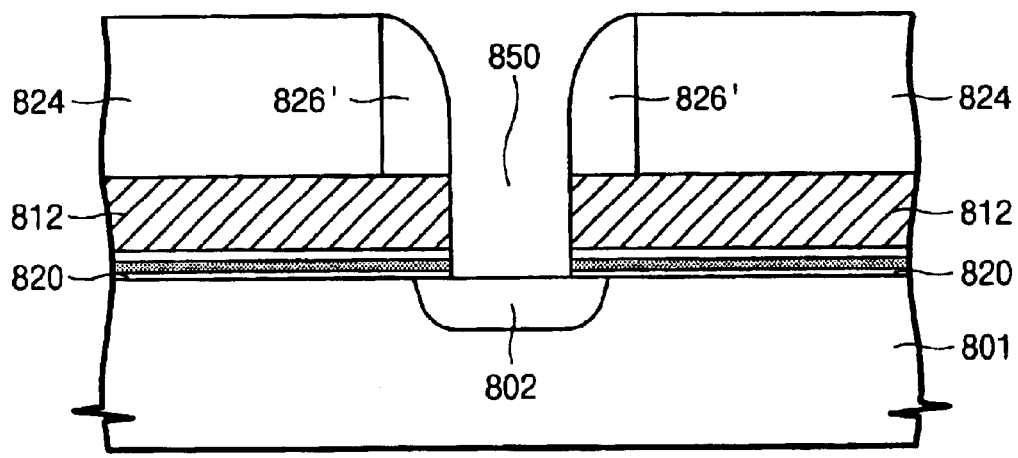

Referring to FIG. 9D, the gate mask layer 826 is anisotropically etched to form gate masks 826' on the control gate layer 812 and on sidewalls of the disposable patterns 824. The gate masks 826' extend to adjacent cells in the row direction. Subsequently, the charge storage layer 820 and the control gate layer 812 are etched using the gate masks 826' and the disposable patterns 814 as etching masks, thereby exposing the substrate 801 and forming a source contact 850. A source 802 is formed using the same method as the first embodiment. A thermal annealing may be performed to activate impurities of the source 802.

Figure 9E:
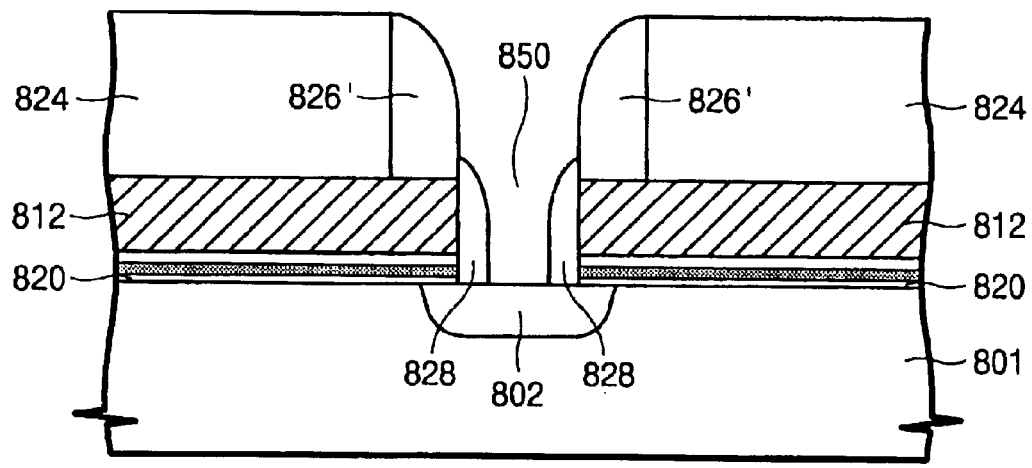

Referring to FIG. 9E, source-side spacers 828 are formed on sidewalls of the charge storage layer 820 and control gate layers 812 using the same method as the first embodiment.

Figure 9F:
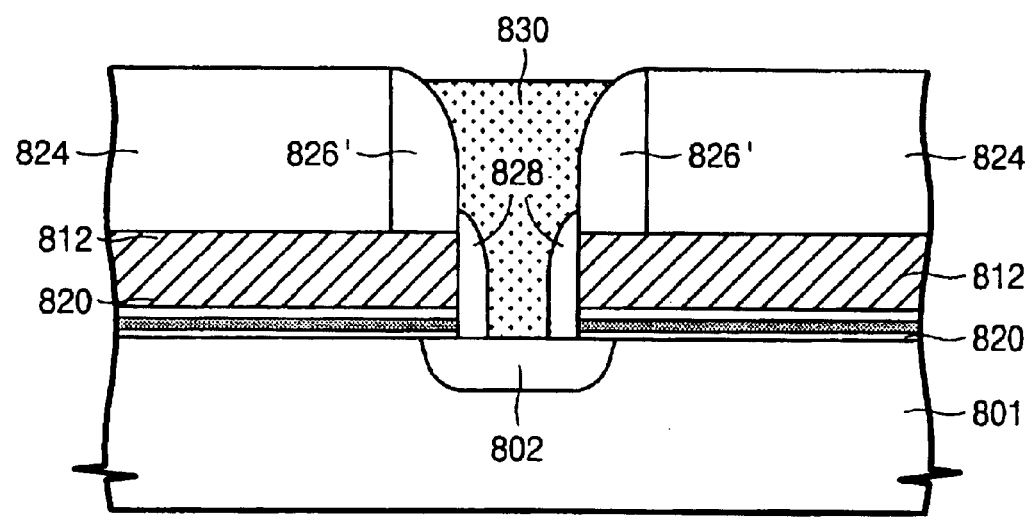

Referring to FIG. 9F, a source electrode 830 is formed in the source contact 850 using the same method as the first embodiment.

Figure 9G:
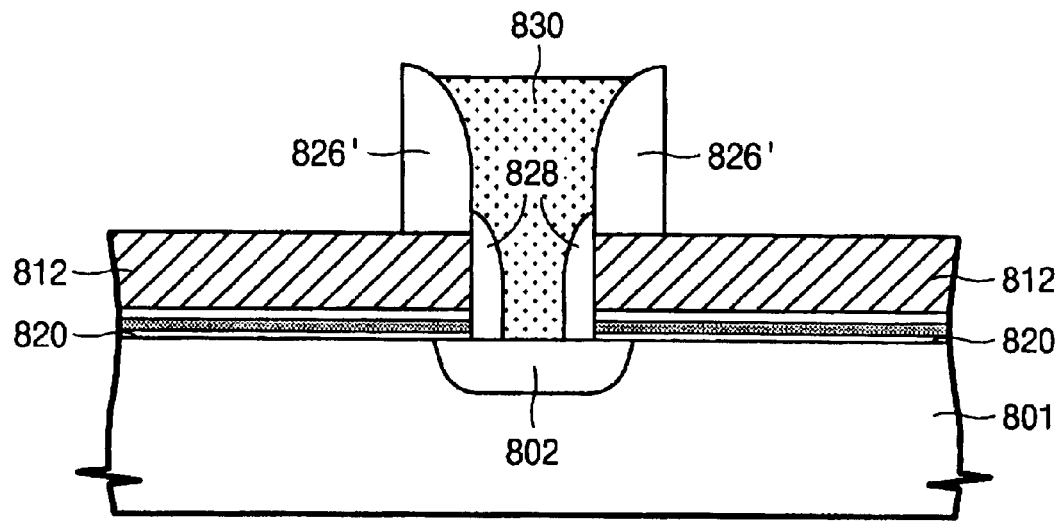

Referring to FIG. 9G, the disposable patterns 824 are removed by a dry etching or a wet etching method.

Figure 9H:
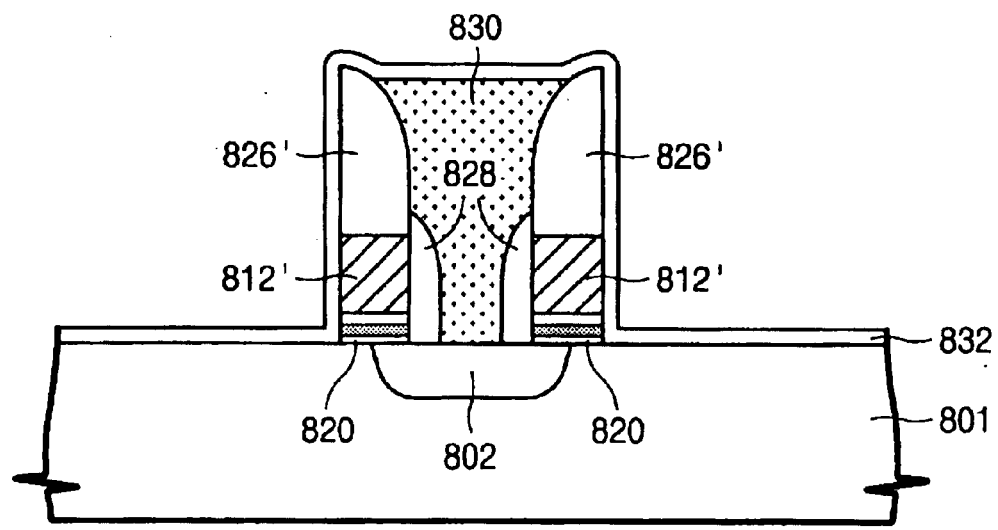

Referring to FIG. 9H, the charge storage layers 820 and the control gate layers 812 are etched again using the gate masks 826' and the source electrode 830 as etching masks. As a result, control gates 812' and charge storage regions are formed and a portion of the substrate is exposed. During this etching, a portion of the source electrode 830 may be etched, thereby being recessed. The control gates 812' and the charge storage regions extend to adjacent cells in row direction. Subsequently a select gate dielectric layer 832 is formed on the resultant structure. The select gate dielectric layer 832 is preferably composed of CVD silicon dioxide. A thin thermal oxide layer may be formed on the exposed portion of the substrate, before the formation of the select gate dielectric layer 832.

Figure 9I:
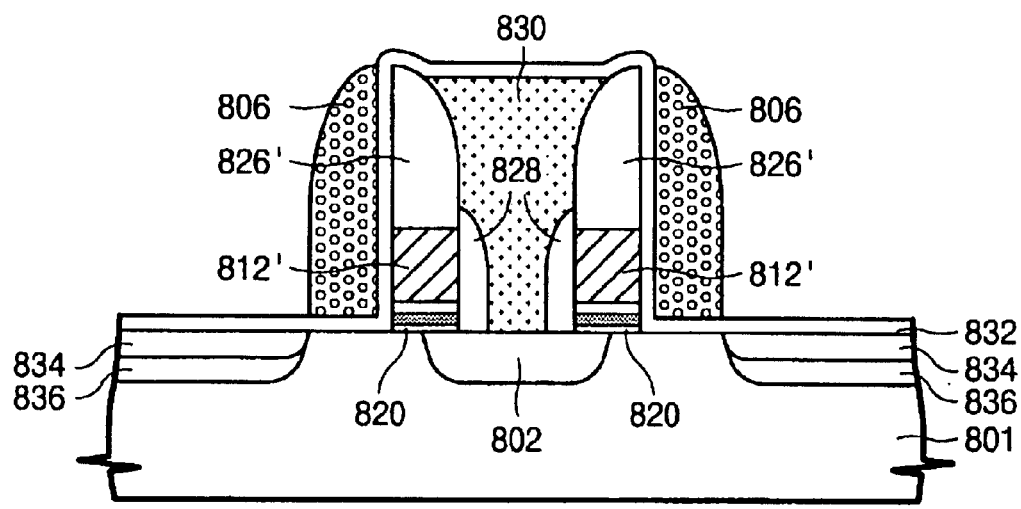

Referring to FIG. 9I, select gates 806 are formed on sidewalls of the control gates 812' and the charge storage layers 820 using the same method as the first embodiment. Subsequently, LDD regions 834 and halo regions 836 are formed using the same method as the first embodiment.

Figure 9J:
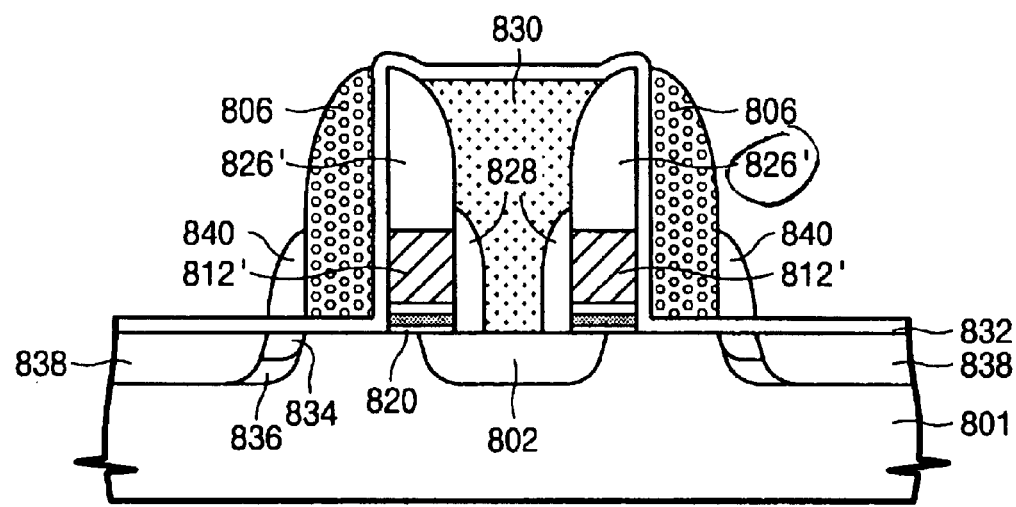
Figure 5:
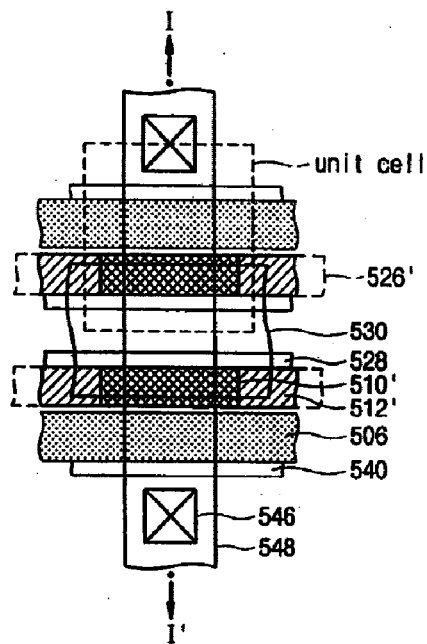
Figure 6:
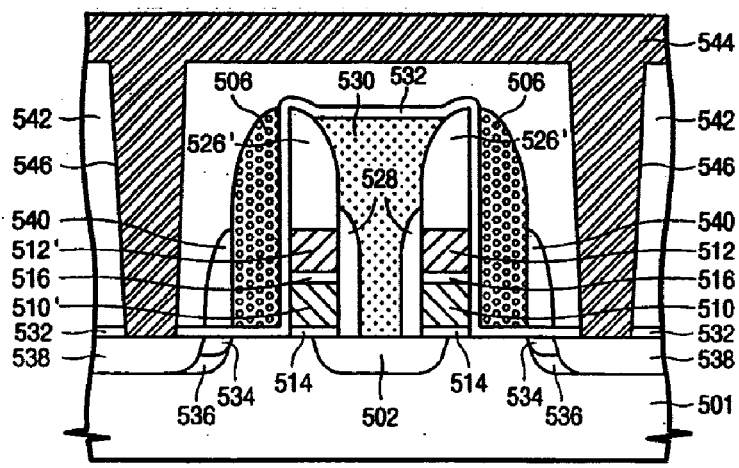
Figure 7G:
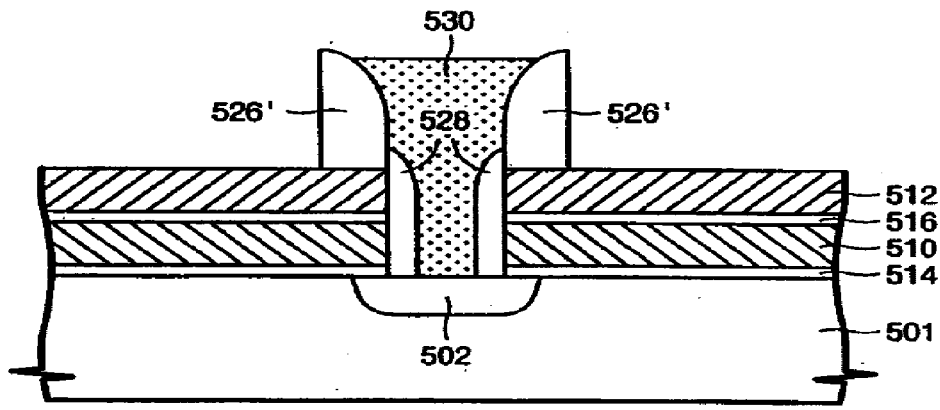
Figure 7H:
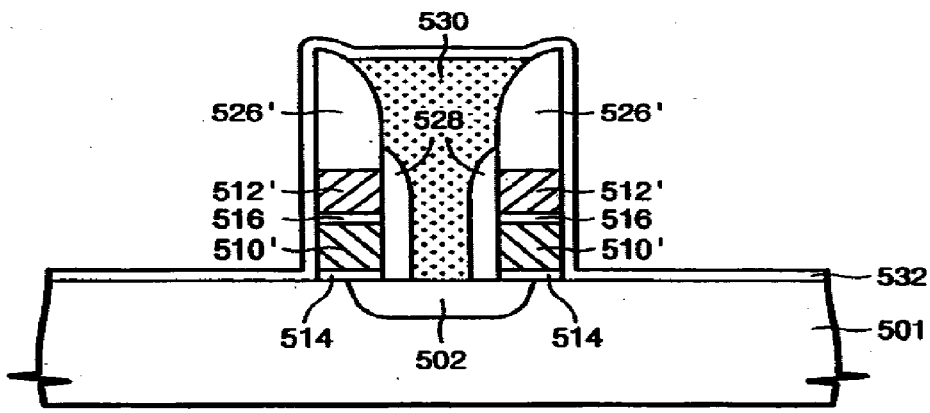
Figure 7I:
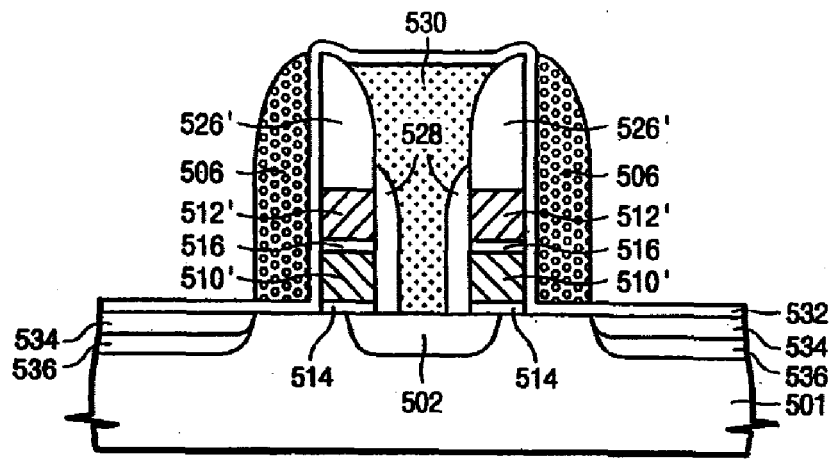
Figure 7J:
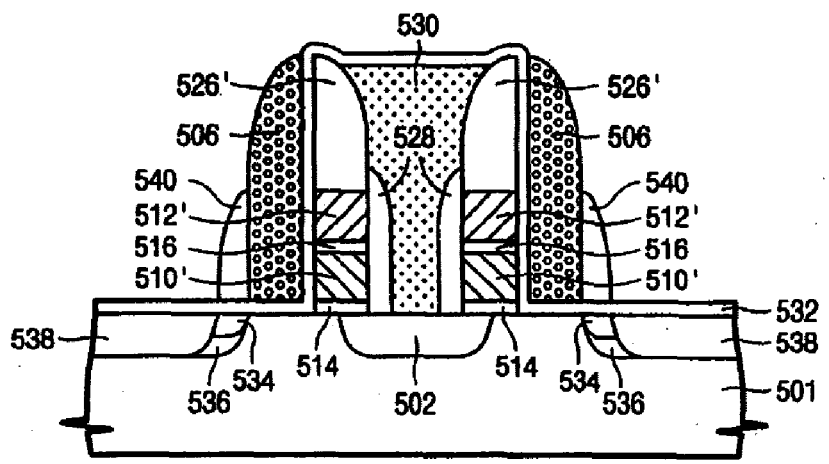
Figure 9I:
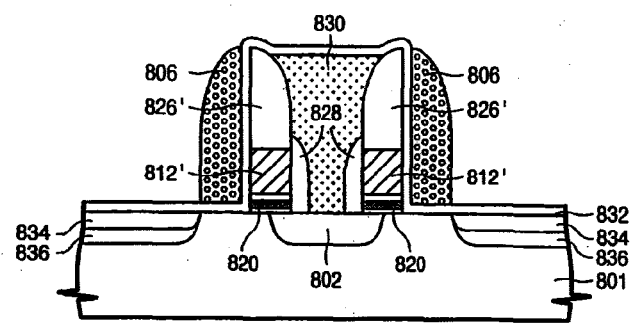
Figure 9J:
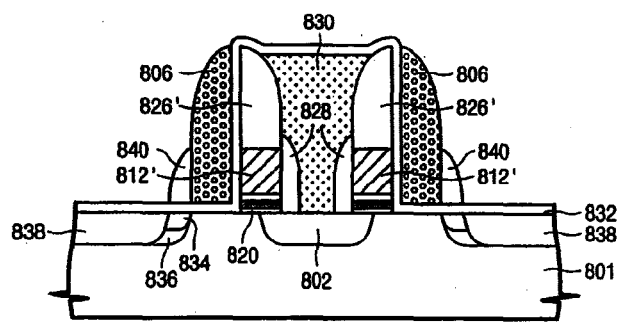

Referring to FIG. 9J, LDD spacers 840 are formed on sidewalls of the select gates 806 using the same method as the first embodiment. Highly doped regions 838 are formed in the substrate 810 using the same method as the first embodiment. The LDD region 834, the halo region 836 and the highly doped region 838 constitute a drain.

Subsequently, a conventional metalization process is performed as in the first embodiment.

According to the first and the second embodiments of the present invention, the control gate layer and charge storage layer are patterned under protection of gate masks having the spacer-shape as an etching mask. This patterning method can also be used for forming non-volatile memory cells that do not include select gates. That is to say, following the step illustrated in FIG. 7H of the first, or 9H of the second, embodiments, the select gate formation step can be skipped. Subsequently, drains can be formed in the substrate adjacent to the charge storage region by an ion implantation using gate masks and source electrode as implantation masks. A conventional metalization process can then be performed. As a result, cells that do not include select gates can be fabricated.

According to the present invention, the spacer formation technique is used several times. As described above, general spacer formation technique includes depositing a layer on a structure having a step difference and anisotropically etches the layer. A final spacer width is determined by a thickness of the deposited layer. In other words, the thicker the layer is, the wider the spacer. Therefore, decreasing the thickness of the layer can decrease the width of the spacer to the extent of being under a photolithographic resolution limitation. As a result, a size of the cells of the present invention which uses the spacer formation technique can be minimized.

According to the second embodiments of the present invention, there is no need to pattern the ONO layer prior to the formation of the control gate layer, as shown in FIG. 9A. However, the floating gate layer should be patterned prior to the formation of the inter poly dielectric layer and control gate layer in the FIG. 7A and FIG. 8A first embodiments. Therefore, the process of the second embodiments is simpler than that of the first embodiment. This is because ONO layer is not conductive so that charges trapped in the ONO layer are not moved from one cell to another cell.

While the invention has been particularly shown and described with reference to the preferred embodiments thereof, it will be understood by those skilled in the art that various changes in form and details may be made without departing from the spirit and scope of the invention.

In the drawings and specification, there have been disclosed typical preferred embodiments of the invention and, although specific terms are employed, they are used in a generic and descriptive sense only and not for purpose of limitation, the scope of the invention being set forth in the following claims.

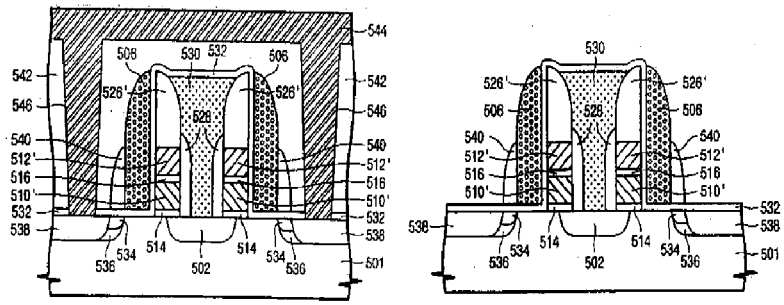

What is claimed is:

1. A non-volatile semiconductor memory device comprising:
    a substrate;
    a charge storage region on the substrate;
    a conductive region formed in a top portion of the substrate adjacent a sidewall of the charge storage region;
    a control gate on the charge storage region;
    a source electrode on the conductive region, wherein the source electrode is electrically isolated from the control gate by a source-side insulative spacer; and
    a gate mask on the control gate, wherein the gate mask is in the shape of a spacer, the gate mask having a width that is substantially equal to a width of the underlying charge storage region and a width of the control gate, wherein the source electrode is of a height that is equal to or lower than a top of the gate mask.

2. A non-volatile semiconductor memory device according to claim 1, further comprising:
    a select gate formed on the substrate and a sidewall of the charge storage region, the charge storage region, the control gate, the gate mask and the select gate forming a first unit cell.

3. A non-volatile semiconductor memory device according to claim 2 further comprising a second unit cell being symmetrical and opposite to the first unit cell, wherein the first unit and the second unit cell share the conductive region.

4. A non-volatile semiconductor memory device according to claim 2, wherein the first unit cell further comprises a LDD spacer on a sidewall of the select gate.

5. A non-volatile semiconductor memory device according to claim 2 further comprising:
    a drain formed in the substrate adjacent to the select gate and opposite to the conductive region; and
    a bit line electrode electrically connected to the drain.

6. A non-volatile semiconductor memory device according to claim 2, wherein the select gate is in the shape of a spacer.

7. A non-volatile semiconductor memory device according to claim 1, wherein the charge storage region comprises:
    a floating gate dielectric layer on the substrate;
    a floating gate on the floating gate dielectric layer; and
    an inter poly dielectric layer on the floating gate.

8. A non-volatile semiconductor memory device according to claim 1, wherein the charge storage region comprises an ONO layer.

9. A non-volatile semiconductor memory device comprising:
    a substrate having a source and a drain;
    a channel between the source and the drain;
    a charge storage region over the channel;
    a control gate over the charge storage region;
    a gate mask on an entire top surface of the control gate and being in the shape of a spacer, the gate mask having a width that is substantially equal to a width of the underlying charge storage region and a width of the control gate; and
    a select gate on the channel and between the charge storage region and the drain; the charge storage region, the channel, the drain, the control gate and the select gate forming a first unit cell.

10. A non-volatile semiconductor memory device according to claim 9 further comprising a second unit cell being symmetrical and opposite to the first unit cell, wherein the first unit and the second unit cell share the source.

11. A non-volatile semiconductor memory device according to claim 9, wherein the select gate is in the shape of a spacer.

12. A non-volatile semiconductor memory device according to claim 9 further comprising a LDD spacer on a sidewall of the select gate.

13. A non-volatile semiconductor memory device according to claim 9 further comprising:
    a bit line electrode connected to the drain; and
    a source electrode on the source, wherein the source electrode is electrically isolated from the control gate by a source-side spacer.

14. A non-volatile semiconductor memory device according to claim 9, wherein the charge storage region comprises:
- a floating gate dielectric layer on the substrate;
- a floating gate on the floating gate dielectric layer; and
- an inter poly dielectric layer on the floating gate.

15. A non-volatile semiconductor memory device according to claim 9, wherein the charge storage region comprises an ONO layer.

* * * * *

UNITED STATES PATENT AND TRADEMARK OFFICE
CERTIFICATE OF CORRECTION

PATENT NO. : 6,784,476 B2
DATED : August 31, 2004
INVENTOR(S) : Kim et al.

It is certified that error appears in the above-identified patent and that said Letters Patent is hereby corrected as shown below:

Title page
Title page illustrating figure(s) should be deleted, and substituted therefore, the title page illustrating figure(s). (attached)

Drawings
Delete drawing sheets 4, 8, 9 & 19, and substitute therefore, drawing sheets 4, 8, 9 & 19. (attached)

Column 9,
Line 64, delete "gale" and insert -- gate --.

Signed and Sealed this

Fifth Day of April, 2005

JON W. DUDAS
*Director of the United States Patent and Trademark Office*

(12) United States Patent
Kim et al.

(10) Patent No.: US 6,784,476 B2
(45) Date of Patent: Aug. 31, 2004

(54) SEMICONDUCTOR DEVICE HAVING A FLASH MEMORY CELL AND FABRICATION METHOD THEREOF

(75) Inventors: Dong-Jun Kim, kyunggi-do (KR); Jin-Ho Kim, San Jose, CA (US); Yong-Kyu Lee, kyunggi-do (KR); Min-Soo Cho, Kyunggi-do (KR); Eui-Youl Ryu, Daejeon-shi (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/039,126

(22) Filed: Jan. 3, 2002

(65) Prior Publication Data

US 2002/0100926 A1 Aug. 1, 2002

(30) Foreign Application Priority Data

Jan. 31, 2001 (KR) .............................. 2001-04588

(51) Int. Cl.$^7$ ...................... H01L 27/108; H01L 29/76; H01L 29/94; H01L 31/119
(52) U.S. Cl. ............................ 257/296; 257/314
(58) Field of Search .................................. 257/296, 311, 257/315, 316, 314, 319, 320, 318, 336, 344, 408, 549, 550

(56) References Cited

U.S. PATENT DOCUMENTS

| | | | |
|---|---|---|---|
| 4,558,344 A | 12/1985 | Perlegos | 357/59 |
| 4,698,787 A | 10/1987 | Mukherjee et al. | 365/185 |
| 4,783,766 A | 11/1988 | Samachisa et al. | 365/185 |
| 4,794,565 A | 12/1988 | Wu et al. | 365/185 |
| 4,851,365 A | 7/1989 | Jeuch | 438/257 |
| 4,852,062 A | 7/1989 | Baker et al. | 365/185.15 |
| 5,073,513 A | 2/1991 | Lee | 438/267 |
| 5,120,672 A | 6/1992 | Mitchell et al. | 438/261 |
| 5,280,446 A | 1/1994 | Ma et al. | 365/185 |
| 5,455,792 A * | 10/1995 | Yi | 365/185.12 |
| 5,498,558 A | 3/1996 | Kapoor | 437/43 |
| 5,930,631 A | 7/1999 | Wang et al. | 438/286 |
| 6,043,530 A * | 3/2000 | Chang | 257/320 |
| 6,101,131 A * | 8/2000 | Chang | 365/185.33 |
| 6,125,060 A | 9/2000 | Chang | 365/185.29 |
| 6,177,315 B1 * | 1/2001 | Bergemont et al. | 438/258 |
| 6,232,185 B1 * | 5/2001 | Wang | 438/266 |
| 6,291,297 B1 | 9/2001 | Chen | 438/265 |
| 6,433,382 B1 * | 8/2002 | Orlowski et al. | 257/315 |
| 6,459,121 B1 * | 10/2002 | Sakamoto et al. | 257/315 |
| 6,583,009 B1 | 6/2003 | Hui et al. | 438/264 |

OTHER PUBLICATIONS

Watanabe, et al., 1998 IEDM Technical Digest, p. 975, "Novel 0.44 um 2 Ti-salicide STI cell technology for high-density NOR flash memories and high performance embedded application".

* cited by examiner

*Primary Examiner*—David Nhu
(74) *Attorney, Agent, or Firm*—Mills & Onello, LLP

(57) ABSTRACT

In a non-volatile semiconductor memory device and a fabrication method thereof, a charge storage layer is formed on a substrate. A control gate layer is formed on the charge storage layer. A gate mask having a spacer-shape is formed on the control gate layer. The charge storage layer and the control gate layer are removed using the gate mask as protection to form a control gate and a charge storage region.

15 Claims, 19 Drawing Sheets